Dec. 3, 1968 M. G. WILSON 3,414,831

CASCADED CONNECTED TRANSISTORIZED OPERATIONAL AMPLIFIER

Filed Oct. 6, 1965

INVENTOR

MELVIN G. WILSON

BY Sughrue, Rothwell, Mion, Zinn & Macpeak

ATTORNEYS 3,414,831
CASCADED CONNECTED TRANSISTORIZED OPERATIONAL AMPLIFIER

Melvin G. Wilson, Rochester, Minn., assignor to International Business Machines Corporation, Armonk, N.Y., a corporation of New York
Filed Oct. 6, 1965, Ser. No. 493,395
9 Claims. (Cl. 330—20)

ABSTRACT OF THE DISCLOSURE

A transistorized operational amplifier includes a differential input stage, a collector-to-base feedback stage, a grounded base stage, and an emitter follower inverter feedback pair. The circuit results in an overall imperviousness to power supply variations. The amplifier also includes two compound roll-off networks for preventing oscillations.

The invention relates to operational amplifiers and more particularly to differential operational amplifiers which are substantially insensitive to changes in the power supply.

Differential operational amplifier circuits are well known in the art and have many known uses. In the ideal differential operational amplifier the open loop output variation is zero as a function of the supply voltage changes. However, in most known operational amplifier designs, the output level variation is quite sizable as a function of at least one or two of the supply voltages (i.e., order of 25% to 200%, depending upon the specific design).

The operational amplifier of the present invention is designed to be substantially insensitive to power supply variations, except for some second order effects. A feature of the invention is the inclusion of two compound roll-off networks designed to produce a 6 db peak in the closed loop response at 500 kc. and a 12 db/octave roll-off from 500 kc. to approximately 10 megacycles. An additional feature in the present invention is the use of an operational amplifier of a roll-off network comprising a relatively large inductance and a relatively small inductance in series to form a large inductance having a high resonant frequency ($f_r$). The latter feature provides a large circuit inductance which appears susbtantially as a pure inductance at high frequencies.

It is therefore an object of the present invention to provide a new and improved differential amplifier which is substantially insensitive to power supply variations.

A further object of the present invention is to provide a new and improved differential operational amplifier which produces a substantially 12 db roll-off characteristic at desired frequencies, and is substantially independent of power supply variations.

The foregoing and other objects, features and advantages of the invention will be apparent from the following more particular description of a preferred embodiment of the invention, as illustrated in the accompanying drawings, wherein.

Figures 1, 2:
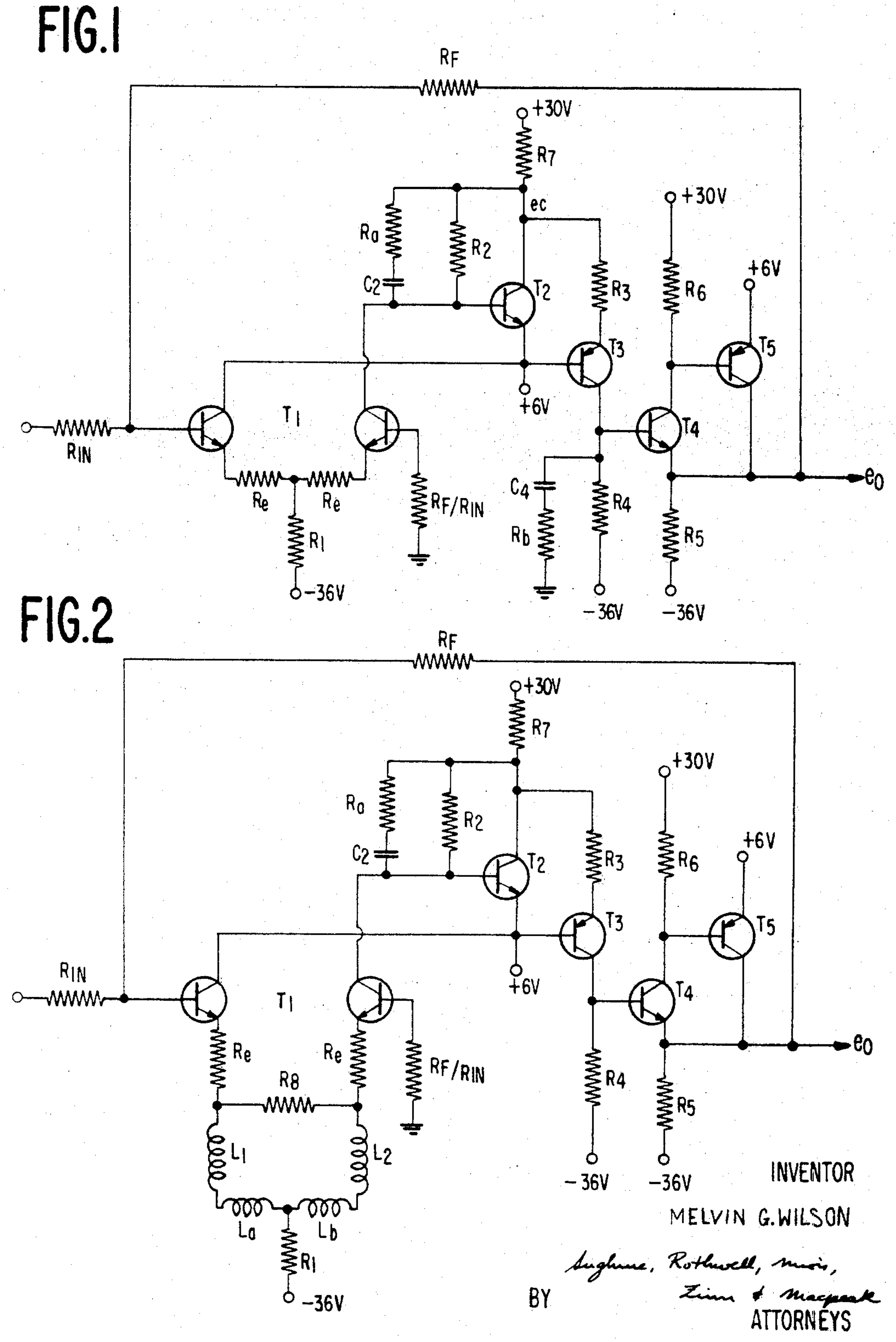
FIGURE 1 is a schematic diagram of a preferred embodiment of the invention.
FIGURE 2 is a schematic diagram of the invention showing an inductive roll-off network in the emitter circuit of the differential stage.

The operational amplifier of FIGURE 1 includes an input resistance $R_{in}$, a feedback resistance $R_f$ and an output $e_0$. The internal circuitry of the amplifier comprises a differential input stage $T_1$, a collector-to-base feedback stage $T_2$, a grounded base stage $T_3$, and an emitter follower inverter feedback pair $T_4$ and $T_5$. Emitter resistance $r_e$ are connected at one end, respectively, to the emitters of transistors $T_1$ and are connected together at their other ends. The common junction is connected to the −36 volt power supply terminal through resistance $R_1$. A base resistance which is equal to the ratio of the feedback resistance to the input resistance is connected to the base of the transistor forming the $T_1$ differential stage.

The collector-to-base feedback path of feedback stage $T_2$ includes resistance $R_2$ in parallel with the series connection of the resistance $R_a$ and capacitance $C_2$. Capacitor $C_2$ and resistor $R_2$ form the main roll-off network. Resistor $R_a$ together with capacitor $C_2$ tend to counteract the main roll-off network and cause leveling out, for open loop response, in this particular instance at approximately 450 kc. The collector of $T_2$ is also connected through $R_7$ to the +30 volt power supply terminal and through $R_3$ to the emitter of grounded base stage $T_3$. The collector of $T_3$ is connected through resistance $R_4$ to the −36 volt power supply terminal. The second roll-off network is formed by capacitor $C_4$ and resistor $R_4$. Resistor $R_b$ functions similar to resistor $R_a$.

The output from the grounded base transistor $T_3$ is applied to the base of $T_4$ which forms part of the emitter follower feedback pair, the other part comprising transistor $T_5$. The collector of $T_4$ and the base of $T_5$ are connected together and to the +30 volt terminal of the power supply through resistance $R_6$. The emitter of $T_4$ and collector $T_5$ are connected together and through $R_5$ to the −36 volt terminal of the power supply. The emitter of $T_4$ forms the output of the amplifier and is connected back to the input through the feedback resistance $R_f$.

The values of the circuit parameters for FIGURES 1 and 2 are given in the component list which appears at the end of the specification. The values given are by way of example only.

The particular circuits shown in FIGURES 1 and 2 are designed to be relatively insensitive at the output to changes in the −36 volt, +30 volt and +6 volt power supplies. It can be shown mathematically that a change in the open loop output voltage ($\Delta e_0$) is dependent upon the change in the −36 volt power supply, as follows:

$$\Delta e_0 = \Delta E\left(1-\frac{R_2R_4}{2R_1R_3}\right)$$

where ΔE equals the change in the −36 volt supply. Hence, by setting $R_2R_4/2R_1R_3$ very close to 1, the open loop output will be substantially insensitive to changes in the −36 volt supply. The values shown in the component list sets $R_2R_4/2R_1R_3$ equal to 1.06, which is sufficient to render $e_0$ substantially insensitive to the changes in the negative power supply.

A variation in the +6 volt supply is seen immediately at the base of the grounded base transistor stage $T_3$. It should be noted at this point that the variation which is being considered is within limits which prevent saturation of either $T_1$ or $T_3$. The variation of the +6 volt supply causes a variation in the $T_1$ collector current, which in turn causes a variation in the voltage drop across $R_2$. In this manner, the +6 volt supply variation is coupled to the collector of $T_2$ which in turn is coupled to the emitter of $T_3$ via resistance $R_3$. Since both the base and emitter of transistor $T_3$ see the voltage supply change, there is no variation in the output of $T_3$ in response thereto.

The +30 volt supply fluctuations have no effect on the output level to a first order approximation. The collector of $T_3$ is maintained at a potential determined essentially by the $T_1$ collector current through $R_2$. The +30 volts merely supplies enough current for the collector of $T_1$ plus the emitter of $T_3$, the excess being absorbed through the collector $T_2$. However, there is a second order effect of the +30 volt fluctuations due to the finite beta of transistor $T_2$. As just stated, variations of the +30 volt supply do cause a change in the $T_2$ collector current. This in turn causes a change in the base current of $T_2$ reflecting itself in a change of potential drop through $R_2$. The change in the collector current of $T_2$ is approximately equal to $\Delta E/R_7$, where $\Delta E$ is the change in the +30 volt supply. The change in the $T_2$ base current which is equal to the change in the $T_2$ collector current divided by beta is therefore equal to $\Delta E/R_7\beta$. The change in the collector potential of $T_2$ ($\Delta e_c$) is equal to the change in the base current times $R_2$, and is therefore equal to $\Delta ER_2/R_7\beta$. For the component values listed below, and using a typical beta of 100, the factor $R_2/R_7\beta$ equals 0.025 and $e_0$ is approximately equal to $6e_c$. Therefore, $\Delta e_0=0.15\Delta E$, where $\Delta E$ is equal to the variation of the +30 volt supply.

The two roll-off networks for the amplifier are $R_2C_2$ and $R_4C_4$. These networks are designed to produce a 6 db peak in the closed loop response at 500 kc. and a 12 db/octave roll-off from 500 kc. to approximately 10 megacycles. The values of $R_a$ and $R_b$ are selected to cause the roll-off network to level out at 10 megacycles.

At high frequencies, the impedance of the second roll-off network ($R_4C_4$) becomes so low that only a relatively small amplitude of undistorted signal is realizable due to the limit of available current from the differential stage $T_1$ (0.5 volt peak-to-peak at 500 kc.). This difficulty may be obviated by eliminating the second RC series network and substituting therefor an R–L network in the emitter circuit of the input differential stage. This substitution is shown in FIGURE 2 wherein the circuit is identical to FIGURE 1 except that an R–L roll-off network is used in the emitter circuit of the differential stage rather than the connection of $R_4$ and $C_4$. The particular arrangement shown in FIGURE 2 allows a 6-volt peak-to-peak undistorted output at 500 kc.

In the R–L circuit, a certain value of L is needed to provide the desired characteristics previously described. All inductances have stray capacitances, however, which introduce unwanted phase problems. These problems can be substantially overcome by splitting the inductance L into a relatively large inductance $L_1$ and a relatively small inductance $L_a$. For the circuit shown, $L_1$ is equal to 120 microhenries, $L_a$ is equal to 13 microhenries. The resonant frequence of $L_1$ and $L_2$ is around 5 megacycles, whereas the resonant frequency of the smaller inductances $L_a$ and $L_b$ is around 40 megacycles. Due to the splitting of the inductance, the total L has a high resonant frequency and therefore appears as a pure inductance at high frequencies, thereby reducing the stray capacitance problem.

The following is a list of components shown in FIGURES 1 and 2 which are given by way of example only and are not intended to limit the invention in any manner.

$R_1$=17.7K
$R_2$=6.04K
$R_3$=1.47K
$R_4$=9.13K
$R_5$=2.7K
$R_6$=27K
$R_7$=2.4K
$R_a$=300
$R_b$=430
$R_8$=1.0K
$L_1=L_2$=120 μh. (fr.>5 mc.)
$L_a=L_b$=13 μh. (fr.>40 mc.)
$C_2$=500 pf.
$C_4$=330 pf
$R_e$=18.2

IBM transistors $T_1$–#256 dual pair
$T_2$–1T9
$T_3$–2T3
$T_4$–1T9
$T_5$–125

It can be seen from the above description in conjunction with the drawings that the operational amplifier of the present invention is designed to be substantially insensitive to power supply variations and also to provide desired frequency characteristics.

While the invention has been particularly shown and described with reference to preferred embodiments thereof, it will be understood by those skilled in the art that various changes in form and details may be made therein without departing from the spirit and scope of the invention.

What is claimed is:

1. An amplifier comprising,
(a) an input differential stage of amplification,
(b) a transistor collector-to-base feedback stage of amplification having an input and an output,
(c) means for connecting the output of said differential stage to the input of said feedback stage,
(d) a grounded base transistor amplifier having an input and an output, the input being connected to the feedback stage output,
(e) an emitter follower inverter feedback pair having an input connected to the output of said grounded base amplifier,
(f) and means for applying operating potentials to the stages of said amplifier.

2. The amplifier claimed in claim 1 wherein said feedback stage comprises,
(a) a transistor having collector, base, and emitter electrodes, the base electrode being connected to the output of said differential stage and the collector electrode being connected to the input of said grounded base amplifier,
(b) a substantially 6 db roll-off network connected between the collector and base of said transistor.

3. The amplifier claimed in claim 2 wherein said 6 db roll-off network comprises a resistance in parallel with a capacitance.

4. The amplifier claimed in claim 1 wherein said differential stage of amplification comprises,
(a) first and second like conductivity transistors, the input to said amplifier being connected to the base of said first transistor and the input of said feedback stage being connected to the collector of said second transistor, and
(b) a substantially 6 db roll-off network connected to the emitters of said first and second transistors.

5. The amplifier as claimed in claim 4 wherein said substantially 6 db roll-off network is a resistance-inductance network.

6. The amplifier as claimed in claim 5 wherein the inductances of desired value for producing 6 db roll-off at a desired frequency comprise the series connection of a relatively high valued inductance and a relatively low valued inductance, the sum of the values equalling the desired value.

7. The amplifier as claimed in claim 6 wherein said feedback stage comprises,
(a) a third transistor, the base electrode of said third transistor being connected to the collector of said second transistor, the collector of said third transistor being connected to the input of said grounded base stage, and
(b) a second substantially 6 db roll-off network connected between the collector and base of said third transistor.

8. The amplifier claimed in claim 7 wherein said second 6 db roll-off network comprises a resistance in parallel with a capacitance.

9. The amplifier claimed in claim 8 further comprising means for feeding back the output from said emitter follower inverter feedback pair to the input of said amplifier.

No references cited.

NATHAN KAUFMAN, *Primary Examiner.*